(12) United States Patent
Park

(10) Patent No.: US 12,424,265 B2
(45) Date of Patent: Sep. 23, 2025

(54) CHIP SELECT TRANSMITTERS FOR MULTIPLE SIGNAL LEVELS

(71) Applicant: QUALCOMM Incorporated, San Diego, CA (US)

(72) Inventor: Joon Young Park, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 233 days.

(21) Appl. No.: 18/301,769

(22) Filed: Apr. 17, 2023

(65) Prior Publication Data

US 2024/0347099 A1    Oct. 17, 2024

(51) Int. Cl.
| | | |
|---|---|---|
| *G11C 8/12* | (2006.01) | |
| *G06F 13/16* | (2006.01) | |
| *G11C 7/22* | (2006.01) | |
| *G11C 11/4072* | (2006.01) | |
| *G11C 11/4076* | (2006.01) | |
| *G11C 11/4093* | (2006.01) | |
| *G11C 7/10* | (2006.01) | |

(52) U.S. Cl.
CPC ...... *G11C 11/4076* (2013.01); *G06F 13/1668* (2013.01); *G11C 7/22* (2013.01); *G11C 8/12* (2013.01); *G11C 11/4072* (2013.01); *G11C 11/4093* (2013.01); *G06F 2213/1602* (2013.01); *G11C 7/1084* (2013.01)

(58) Field of Classification Search
CPC ......... G11C 11/4076; G11C 7/22; G11C 8/12; G11C 11/4072; G11C 11/4093; G11C 7/1057; G11C 7/1084; G11C 11/4074; G06F 13/4077; G06F 2213/1602; G06F 2213/3602; G06F 13/1668; G06F 13/1605
See application file for complete search history.

(56) References Cited

U.S. PATENT DOCUMENTS

| | | | |
|---|---|---|---|
| RE49,151 E | 7/2022 | Lim | |
| 2013/0307708 A1* | 11/2013 | Hollis | G11C 7/1057 341/56 |
| 2017/0017587 A1 | 1/2017 | West et al. | |
| 2017/0317675 A1* | 11/2017 | Amiri | H04B 3/04 |
| 2019/0073332 A1* | 3/2019 | Amiri | G06F 13/4072 |

(Continued)

FOREIGN PATENT DOCUMENTS

| | | |
|---|---|---|
| DE | 102010043484 A1 | 5/2012 |
| WO | 2018089064 A1 | 5/2018 |

OTHER PUBLICATIONS

International Search Report and Written Opinion—PCT/US2024/019552—ISA/EPO—Jul. 4, 2024.

*Primary Examiner* — Amir Zarabian
*Assistant Examiner* — Justin Bryce Heisterkamp
(74) *Attorney, Agent, or Firm* — Loza & Loza, LLP

(57) ABSTRACT

A signal driving circuit includes a first transmitting circuit having an input coupled to a source of a chip select signal and an output that is configured to switch within a first voltage range having a first amplitude, a second transmitting circuit having an input coupled to the source of the chip select signal and an output that is configured to switch within a second voltage range having a second amplitude, and an output node coupled to the output of the first transmitting circuit and the output of the second transmitting circuit. The first amplitude may be lower than the second amplitude.

18 Claims, 6 Drawing Sheets

(56) References Cited

U.S. PATENT DOCUMENTS

| | | |
|---|---|---|
| 2019/0295607 A1 | 9/2019 | Hollis et al. |
| 2021/0026789 A1 | 1/2021 | Cheng et al. |
| 2021/0049115 A1 | 2/2021 | Hampel et al. |
| 2022/0070029 A1 | 3/2022 | Chong |
| 2023/0128653 A1* | 4/2023 | You .................... G11C 11/4063 365/218 |

* cited by examiner

CHIP SELECT TRANSMITTERS FOR MULTIPLE SIGNAL LEVELS

TECHNICAL FIELD

The present disclosure relates generally to transitions between low-power and active states in integrated circuits and more particularly to techniques for adjusting voltages of signals provided to memory devices at transitions between low-power and active states.

BACKGROUND

Electronic device technologies have seen explosive growth over the past several years. For example, growth of cellular and wireless communication technologies has been fueled by better communications, hardware, larger networks, and more reliable protocols. Wireless service providers are now able to offer their customers an ever-expanding array of features and services, and provide users with unprecedented levels of access to information, resources, and communications. To keep pace with these service enhancements, mobile electronic devices (e.g., cellular phones, tablets, laptops, etc.) have become more powerful and complex than ever. Wireless devices may include a high-speed bus interface for communication of signals between hardware components.

IC devices may include memory interfaces that have physical layer circuits that are configured to read and write double data rate random access memory devices. Increased demands for higher data rates require tight timing between circuits within the memory interface. Therefore, there is an ongoing need for new techniques that provide reliable training and calibration techniques for components used to receive clock signals over high-speed data links.

Certain devices that are subject to power consumption budgets may be operable at different clock speeds and/or voltage levels in different operational states. For example, battery powered mobile communication handsets typically support full-power, low-power and sleep modes of operation that can be selected based on operational state of the handset, temperature levels within the handset and remaining battery capability or availability of external power supplies. Transitions between active, full-power mode and low-power, idle and/or sleep modes can require changes in voltage at which power is supplied to certain circuits. Transitions between active, full-power mode and low-power, idle and/or sleep modes can require changes in the voltage range of certain signals. There is an ongoing need to improve interface circuits that operate at multiple signaling voltage levels.

SUMMARY

Certain aspects of the disclosure relate to systems, apparatus, methods and techniques for implementing and calibrating a memory interface circuit that can be used with clock signals that can have a frequency that varies over a wide range of frequencies.

In various aspects of the disclosure, a signal driving circuit includes a first transmitting circuit having an input coupled to a source of a chip select signal and an output that is configured to switch within a first voltage range having a first amplitude, a second transmitting circuit having an input coupled to the source of the chip select signal and an output that is configured to switch within a second voltage range having a second amplitude, and an output node coupled to the output of the first transmitting circuit and the output of the second transmitting circuit. The first amplitude may be lower than the second amplitude.

In various aspects of the disclosure, a method for driving a chip select signal includes coupling an input of a first transmitting circuit to a source of a chip select signal, coupling an output of the first transmitting circuit to an output node, coupling an input of a second transmitting circuit to the source of the chip select signal, and coupling an output of the second transmitting circuit to the output node. The first transmitting circuit may be configured to drive the output node within a first voltage range having a first amplitude. The second transmitting circuit may be configured to drive the output node within a second voltage range having a second amplitude. The first amplitude may be lower than the second amplitude.

In various aspects of the disclosure, an apparatus includes means for generating a first output representative of a chip select signal, including a first transmitting circuit having an and an output that is configured to switch within a first voltage range having a first amplitude; means for generating a second output representative of the chip select signal, including a second transmitting circuit having an output that is configured to switch within a second voltage range having a second amplitude; and an output node coupled to the output of the first transmitting circuit and the output of the second transmitting circuit. The first amplitude may be lower than the second amplitude.

In certain aspects, the first transmitting circuit is configured to receive a first enable signal. The output of the first transmitting circuit may actively drive the output node when the first enable signal is asserted. The output of the first transmitting circuit may be placed in a high impedance state when the first enable signal is not asserted. The second transmitting circuit may be configured to receive a second enable signal. The output of the second transmitting circuit may actively drive the output node when the second enable signal is asserted. The output of the second transmitting circuit may be placed in a high impedance state when the second enable signal is not asserted. In one example, the first enable signal is asserted and the second enable signal is not asserted while operating in a first mode of operation. In another example, the first enable signal is not asserted and the second enable signal is asserted while operating in a second mode of operation. The second enable signal may be asserted before the first enable signal is de-asserted at a transition from the first mode of operation to the second mode of operation. The first enable signal may be asserted before the second enable signal is de-asserted at a transition from the second mode of operation to the first mode of operation.

In certain aspects, the, the output node is configured to be coupled to a memory device over a chip select channel. In one example, the memory device is a LPDDR SDRAM.

DETAILED DESCRIPTION

Figure 1:
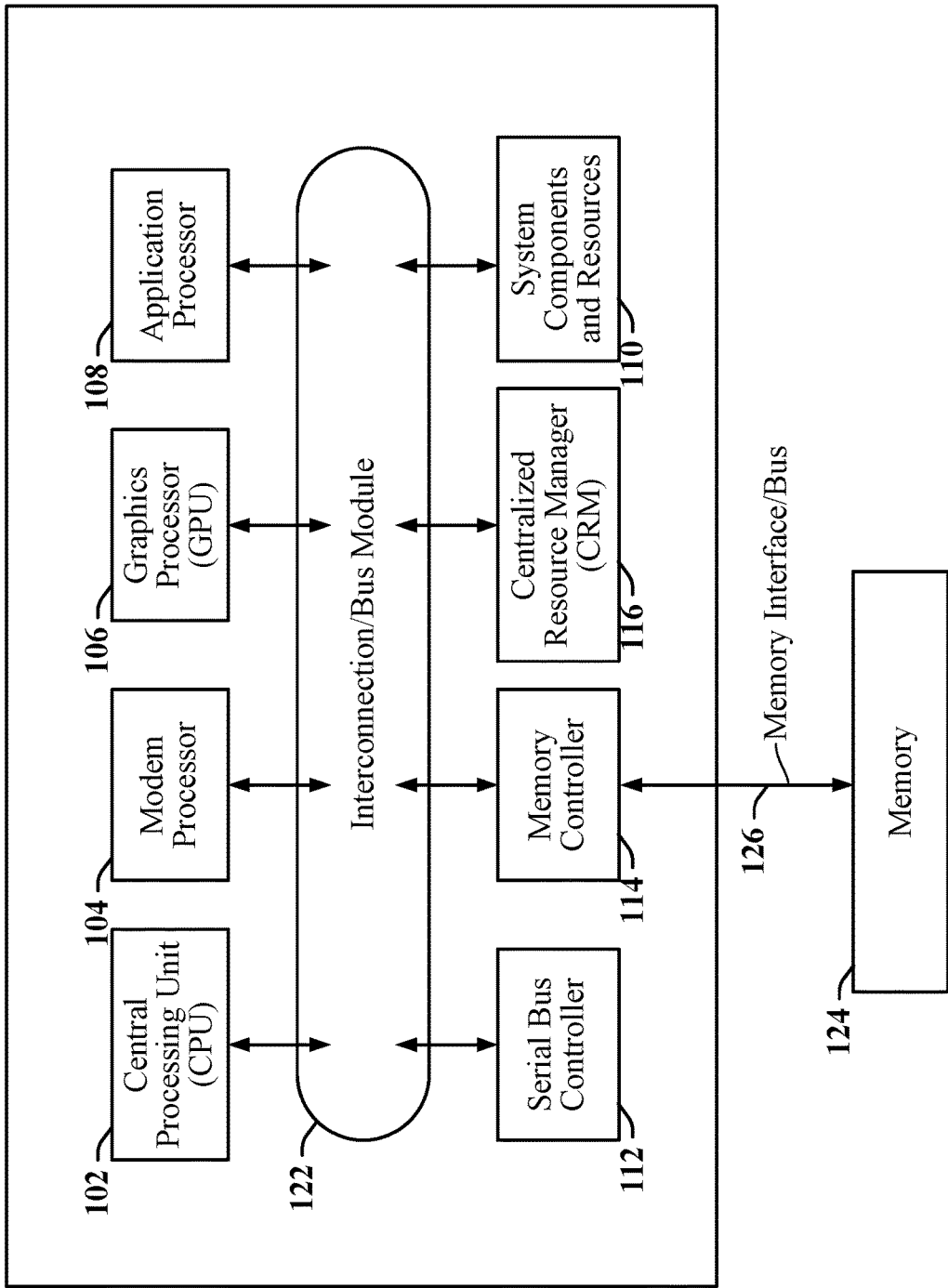
FIG. 1 illustrates example components and interconnections in a system-on-chip (SoC) that may be suitable for implementing certain aspects of the present disclosure.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well-known structures and components are shown in block diagram form in order to avoid obscuring such concepts.

With reference now to the Figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

The terms "computing device" and "mobile device" are used interchangeably herein to refer to any one or all of servers, personal computers, smartphones, cellular telephones, tablet computers, laptop computers, netbooks, ultrabooks, palm-top computers, personal data assistants (PDAs), wireless electronic mail receivers, multimedia Internet-enabled cellular telephones, Global Positioning System (GPS) receivers, wireless gaming controllers, and similar personal electronic devices which include a programmable processor. While the various aspects are particularly useful in mobile devices (e.g., smartphones, laptop computers, etc.), which have limited resources (e.g., processing power, battery, size, etc.), the aspects are generally useful in any computing device that may benefit from improved processor performance and reduced energy consumption.

The term "multicore processor" is used herein to refer to a single integrated circuit (IC) chip or chip package that contains two or more independent processing units or cores (e.g., CPU cores, etc.) configured to read and execute program instructions. The term "multiprocessor" is used herein to refer to a system or device that includes two or more processing units configured to read and execute program instructions.

The term "system on chip" (SoC) is used herein to refer to a single integrated circuit (IC) chip that contains multiple resources and/or processors integrated on a single substrate. A single SoC may contain circuitry for digital, analog, mixed-signal, and radio-frequency functions. A single SoC may also include any number of general purpose and/or specialized processors (digital signal processors (DSPs), modem processors, video processors, etc.), memory blocks (e.g., read only memory (ROM), random access memory (RAM), flash, etc.), and resources (e.g., timers, voltage regulators, oscillators, etc.), any or all of which may be included in one or more cores.

Memory technologies described or referenced herein may be suitable for storing instructions, programs, control signals, and/or data for use in or by a computer or other digital electronic device. Any references to terminology and/or technical details related to an individual type of memory, interface, standard, or memory technology are for illustrative purposes only, and not intended to limit the scope of the claims to a particular memory system or technology unless specifically recited in the claim language. Mobile computing device architectures have grown in complexity, and now commonly include multiple processor cores, SoCs, co-processors, functional modules including dedicated processors (e.g., communication modem chips, GPS receivers, etc.), complex memory systems, intricate electrical interconnections (e.g., buses and/or fabrics), and numerous other resources that execute complex and power intensive software applications (e.g., video streaming applications, etc.).

Certain aspects of the disclosure are applicable to input/out (I/O) circuits that provide an interface between core circuits and memory devices. Many mobile devices employ Synchronous Dynamic Random Access Memory (SDRAM), including Low-Power Double Data Rate SDRAM, which may be referred to as low-power DDR SDRAM, LPDDR SDRAM or, in some instances, LPDDRx where x describes the technology generation of the LPDDR SDRAM. Later generations of LPDDR SDRAM designed to operate at higher operating frequencies may employ lower voltage levels in the core of an SoC or memory device to mitigate for increased power associated with the higher operating frequencies.

Process technology employed to manufacture semiconductor devices, including IC devices is continually improving. Process technology includes the manufacturing methods used to make IC devices and defines transistor size, operating voltages and switching speeds. Features that are constituent elements of circuits in an IC device may be referred as technology nodes and/or process nodes. The terms technology node, process node, process technology may be used to characterize a specific semiconductor manufacturing process and corresponding design rules. Faster and more power-efficient technology nodes are being continuously developed through the use of smaller feature size to produce smaller transistors that enable the manufacture of higher-density ICs.

FIG. 1 illustrates example components and interconnections in a system-on-chip (SoC) 100 that may be suitable for implementing certain aspects of the present disclosure. The SoC 100 may include a number of heterogeneous processors, such as a central processing unit (CPU) 102, a modem processor 104, a graphics processor 106, and an application processor 108. Each processor 102, 104, 106, 108, may include one or more cores, and each processor/core may perform operations independent of the other processors/cores. The processors 102, 104, 106, 108 may be organized in close proximity to one another (e.g., on a single substrate, die, integrated chip, etc.) so that the processors may operate at a much higher frequency/clock rate than would be possible if the signals were to travel off-chip. The proximity of the cores may also allow for the sharing of on-chip memory and resources (e.g., voltage rails), as well as for more coordinated cooperation between cores.

The SoC 100 may include system components and resources 110 for managing sensor data, analog-to-digital conversions, and/or wireless data transmissions, and for performing other specialized operations (e.g., decoding high-definition video, video processing, etc.). System components and resources 110 may also include components such as voltage regulators, oscillators, phase-locked loops (PLLs), peripheral bridges, data controllers, system controllers, access ports, timers, and/or other similar components used to support the processors and software clients running on the computing device. The system components and resources 110 may also include circuitry for interfacing with peripheral devices, such as cameras, electronic displays, wireless communication devices, external memory chips, etc.

The SoC 100 may further include a Universal Serial Bus (USB) or other serial bus controller 112, one or more memory controllers 114, and a centralized resource manager (CRM) 116. The SoC 100 may also include an input/output module (not illustrated) for communicating with resources external to the SoC, each of which may be shared by two or more of the internal SoC components.

The processors 102, 104, 106, 108 may be interconnected to the USB controller 112, the memory controller 114, system components and resources 110, CRM 116, and/or other system components via an interconnection/bus module 122, which may include an array of reconfigurable logic gates and/or implement a bus architecture. Communications may also be provided by advanced interconnects, such as high-performance networks on chip (NoCs).

The interconnection/bus module 122 may include or provide a bus mastering system configured to grant SoC components (e.g., processors, peripherals, etc.) exclusive control of the bus (e.g., to transfer data in burst mode, block transfer mode, etc.) for a set duration, number of operations, number of bytes, etc. In some cases, the interconnection/bus module 122 may implement an arbitration scheme to prevent multiple master components from attempting to drive the bus simultaneously. The memory controller 114 may be a specialized hardware module configured to manage the flow of data to and from memory 124 via a memory interface/bus 126.

The memory controller 114 may comprise one or more processors configured to perform read and write operations with the memory 124. Examples of processors include microprocessors, microcontrollers, digital signal processors (DSPs), field programmable gate arrays (FPGAs), programmable logic devices (PLDs), state machines, gated logic, discrete hardware circuits, and other suitable hardware configured to perform the various functionality described throughout this disclosure. In certain aspects, the memory 124 may be part of the SoC 100.

Figure 2:
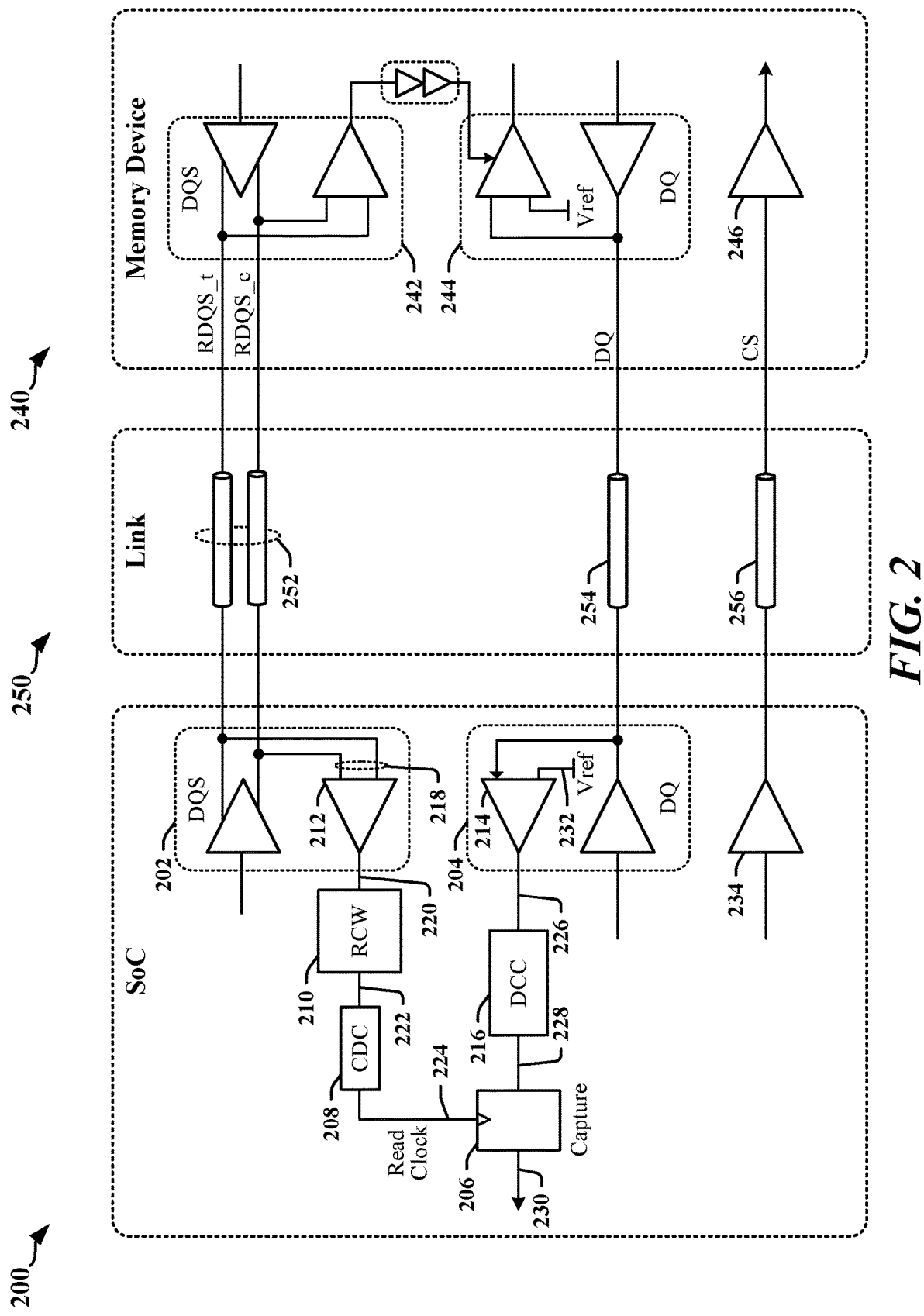
FIG. 2 illustrates aspects of physical layer circuits used to read data from a memory device over a data communication link.

FIG. 2 illustrates certain aspects of physical layer (PHY) circuits that enable an SoC 200 to read data from a memory device 240 over a data communication link 250. In the example shown in FIG. 2, a data channel 254 and data strobe channel 252 and a chip select channel 256 are illustrated. The channels 252, 254, 256 may include wires, metal traces, pads, pins and other interconnects or elements of interconnects. The data channel 254 provides a signal path between a data pin (DQ) in a data transceiver 204 in the SoC 200 and a corresponding data pin (DQ) in a data transceiver 244 in the memory device 240. The data strobe channel 252 provides signal paths for the constituents (RDQS_t and RDQS_c) of a differential receive data strobe signal 218 received from a data strobe transceiver 242 in the memory device 240 to the data strobe transceiver 202 in the SoC 200. Edges or transitions in the data strobe signal 218 received over the data strobe channel 252 provide timing information that can be used to capture data bits from a data signal transmitted over the data channel 254.

The inputs of a differential strobe receiver 212 are configured to receive the differential strobe signal transmitted over the data strobe channel 252. The output of the differential strobe receiver 212 is a single-ended strobe signal 220 that is representative of the data strobe signal and is provided to a read capture window circuit (RCW 210). In one example, the RCW 210 is configured to provide a qualified signal 222 by aligning edges (transitions) in the single-ended strobe signal 220 with transitions in a received data signal 226 output by a pseudo-differential receiver 214 that receives the data signal from the data channel 254 at one input and a reference voltage level (Vref 232) at a second input. As used herein, the term pseudo-differential receiver may refer to a differential receiver that has one of a pair of its inputs coupled to a reference voltage source. In the illustrated example, a calibrated delay circuit (CDC 208) receives the qualified signal 222 and may be configured to produce a read clock signal 224 in which edges occur after transitions between bits in the received data signal 226. The illustrated example also includes a duty cycle correction circuit (DCC 216), that may be configured to maximize the time available for sampling each bit in the received data signal 226. In this example, the output 228 of the DCC 216 may be sampled by a data capture circuit 206 clocked by the read clock signal 224 to provide a data output 230. The data capture circuit 206 may include latches, flipflops, shift registers and combinational logic and other circuits.

The chip select channel 256 provides one or more signal paths for single-ended or differential chip select (CS) signals that are used to select a memory device or a region of a memory device, module or subsystem for reading data, writing data or to receive a command. A CS signal transmitter 234 in the SoC 200 generates a CS signal to be transmitted over the chip select channel 256 to a CS receiver 246 in the memory device 240. The depicted channels 252, 254, 256 are illustrative of channels that, for example, provide signal paths for multi-bit address signals, multi-bit commands and control signals, including control signals that are used to distinguish between read and write operations, indicate that a command is to be received by a memory device, and timing signals define timing used to capture address and command bits.

Multiple signaling schemes may be defined for interface circuits that support certain types of memory devices. For example, an interface circuit that supports LPDDR SDRAM devices may use multiple voltage rails to conserve power and reduce heat generation in mobile, battery-powered operations. The voltage rails are used to distribute power within the IC device and the voltage rails may be configured to provide power at a voltage level that is defined by process technology and that may be configured to comply with industry standards for one or more operating modes. Certain voltage rails may be configured to provide power at a voltage level in a sleep mode and may be reconfigured to provide power at another level in active modes. The amplitude of control, data and/or address signals may be conformed to the voltage levels defined for power supplies in each mode of operation. In one example, LPDDR5 SDRAM and LPDDR6 SDRAM drive CS signals at different signal levels in different operating modes to wake up SDRAM that is in a power down state to save power consumption when used in battery operated or power limited applications such as mobile communications, mobile computing, low-power sensor systems, automotive and artificial intelligence systems.

Figure 3:
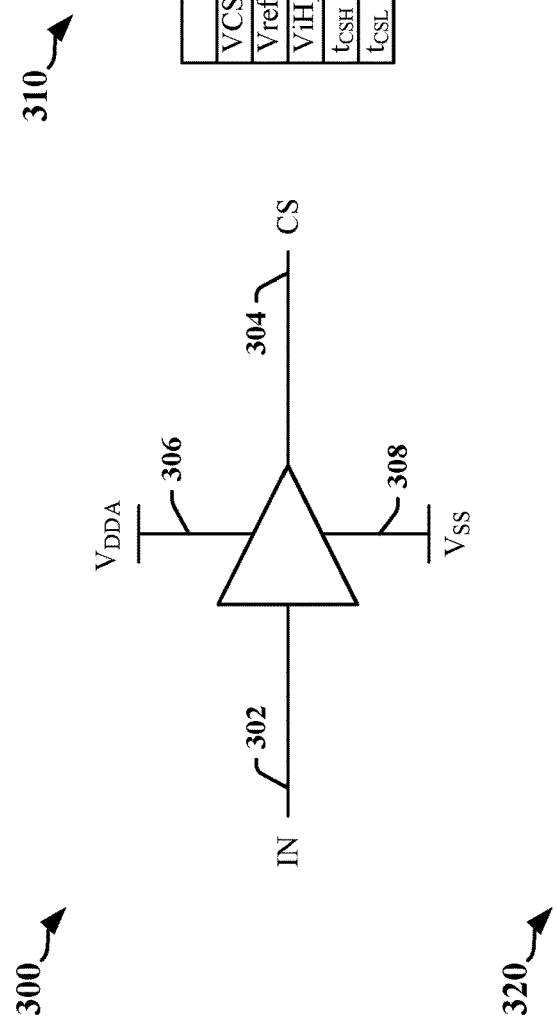
FIG. 3 illustrates a typical chip select signal driver in a conventional dynamic memory interface circuit.
Figure 3:
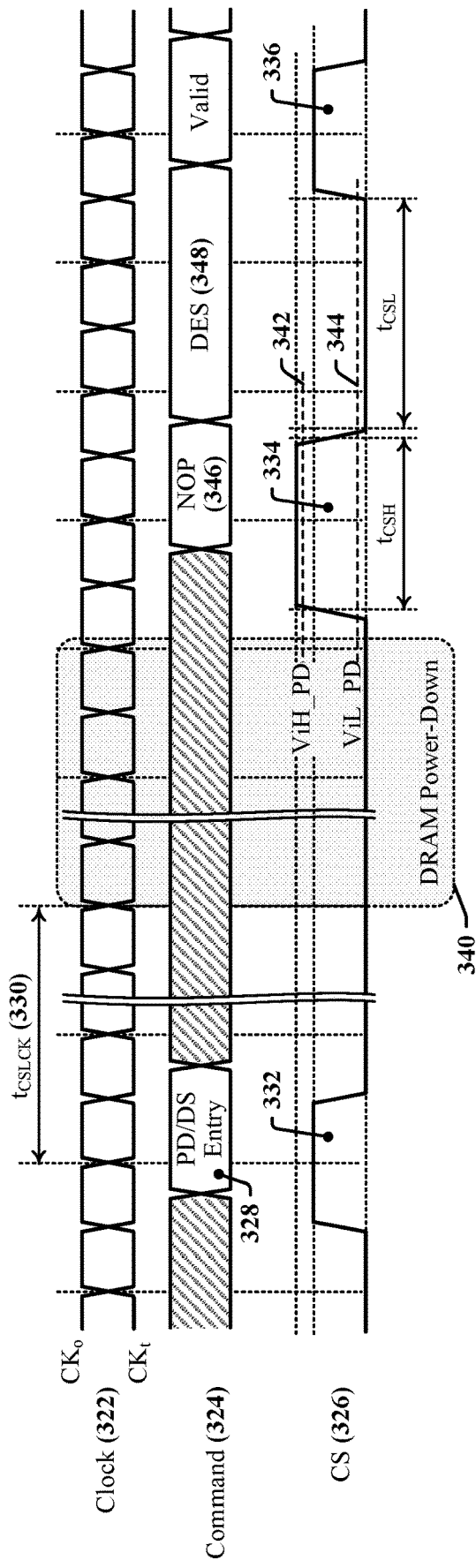

FIG. 3 illustrates a typical CS signal driver 300 in a conventional LPDDR SDRAM interface circuit. The CS signal driver 300 is supplied through a pair of voltage rails (the $V_{DDA}$ rail 306 and the $V_{SS}$ rail 308) that can support the highest signaling amplitude for the CS signal 304, which may correspond to the maximum signaling amplitude for the CS signal 304 to drive a power-down exit signal. During normal, high-speed operations, the CS signal 304 is driven at a lower signaling amplitude to reduce power and decrease switching times, for example. The CS signal driver 300 may include internal circuits that provide a voltage step-up from a low-voltage input signal (the IN signal 302) to a higher voltage CS signal 304. The use of a driver circuit that supports the higher voltage power-down mode signaling can impact switching speed and latencies in high-speed normal modes of operation.

FIG. 3 includes a table 310 that illustrates an example of signaling voltages defined for CS signals in LPDDR5 interfaces. A CS signal driver 300 in a conventional LPDDR5 interface may be designed to support a power-down mode signaling amplitude (ViH_PD) for power-down exit signal driving that is higher than the normal mode signaling amplitude (VCS). In the illustrated example, ViH_PD is more than double VCS. The voltage level of the signaling amplitude in normal mode may correspond to, or be compatible with the voltage level of DRAM input/output (I/O) power supply, which may be referred to herein as the $V_{DDQ}$ voltage level and which may be measured with respect to a common or reference voltage level, which may correspond to or be referred to the $V_{SS}$ voltage level.

The timing diagram 320 in FIG. 3 illustrates certain aspects of CS signaling used to control LPDDR SDRAM devices before and after transitions between a normal mode and in a power-down mode 340. Timing is measured or controlled using a clock signal 322. In the illustrated example, a first pulse 332 is transmitted over the CS channel 326 in normal mode and at the $V_{DDQ}$ voltage level. The first pulse 332 causes an LPDDR SDRAM device to load a power down command 328 transmitted by a memory controller over a command (CA) channel 324. After a delay, the LPDDR SDRAM device enters the power-down mode 340. The LPDDR SDRAM device may be configured to exit the power-down mode 340 in response to pulses transmitted over the CS channel 326 at the higher nominal ViH_PD voltage level 342 relative to a reference or ground voltage level, nominally the VIL_PD voltage level 344. Specifications for the LPDDR SDRAM device may define a minimum lockout period of time ($V_{CSLCK}$ 330) in which the CS is not to be asserted. The duration of $V_{CSLCK}$ 330 may correspond to the time required for the LPDDR SDRAM device to enter the power-down mode 340. The memory controller transmits a second pulse 334 over the CS channel 326 after exiting from the power-down mode 340. The second pulse 334 is transmitted at the higher ViH_PD voltage level 342 and is configured to cause the LPDDR SDRAM device to exit from power-down mode 340.

The memory controller may transmit a no operation (NOP) code over the CA channel 324 while transmitting the second pulse 334 over the CS channel 326. The memory controller may then transmit a device deselect code (the DES code 348) over the CA channel 324 while the CS channel 326 is idle. A third pulse 336 is transmitted over the CS channel 326 with a valid command, which is transmitted over the CA channel 324, when the memory subsystem has resumed normal operation.

LPDDR5 specifications provide for a slower switching rate for CS signaling in order to accommodate the design that is commonly used for the conventional CS signal driver 300. The slower switching rate can alleviate the design complexity needed to optimize for both normal and power-down modes in circuits powered at the ViH_PD voltage level. By way of comparison, the achievable data rate using the conventional CS signal driver 300 may be limited to 1.07 gigabits per second (Gbps), whereas the achievable data rate using a command/address driver is 2.14 Gbps and the achievable data rate using a DQ driver is expected to be about 8.53 Gbps.

Certain aspects of this disclosure relate to a low-complexity driver circuit that can be used to drive variable voltage CS signals without compromising switching rates at the different voltage levels. The presently-disclosed CS signal driving circuit can be configured to support all signaling voltage levels defined for CS signals in LPDDR5 and LPDDR6 SDRAMs. In one aspect, a CS signal driving circuit is disclosed that can be configured independently for each signaling amplitude to accommodate variations in specified CS signal rise and fall times for LPDDR5 and LPDDR6 SDRAMs and for later generations of LPDDR SDRAMs. In one example, the presently disclosed CS signal driving circuit can be configured to support LPDDR6 SDRAM devices in which the CS signal rate can increase to 3.2 Gbps or more in normal and/or power-down modes.

Figure 4:
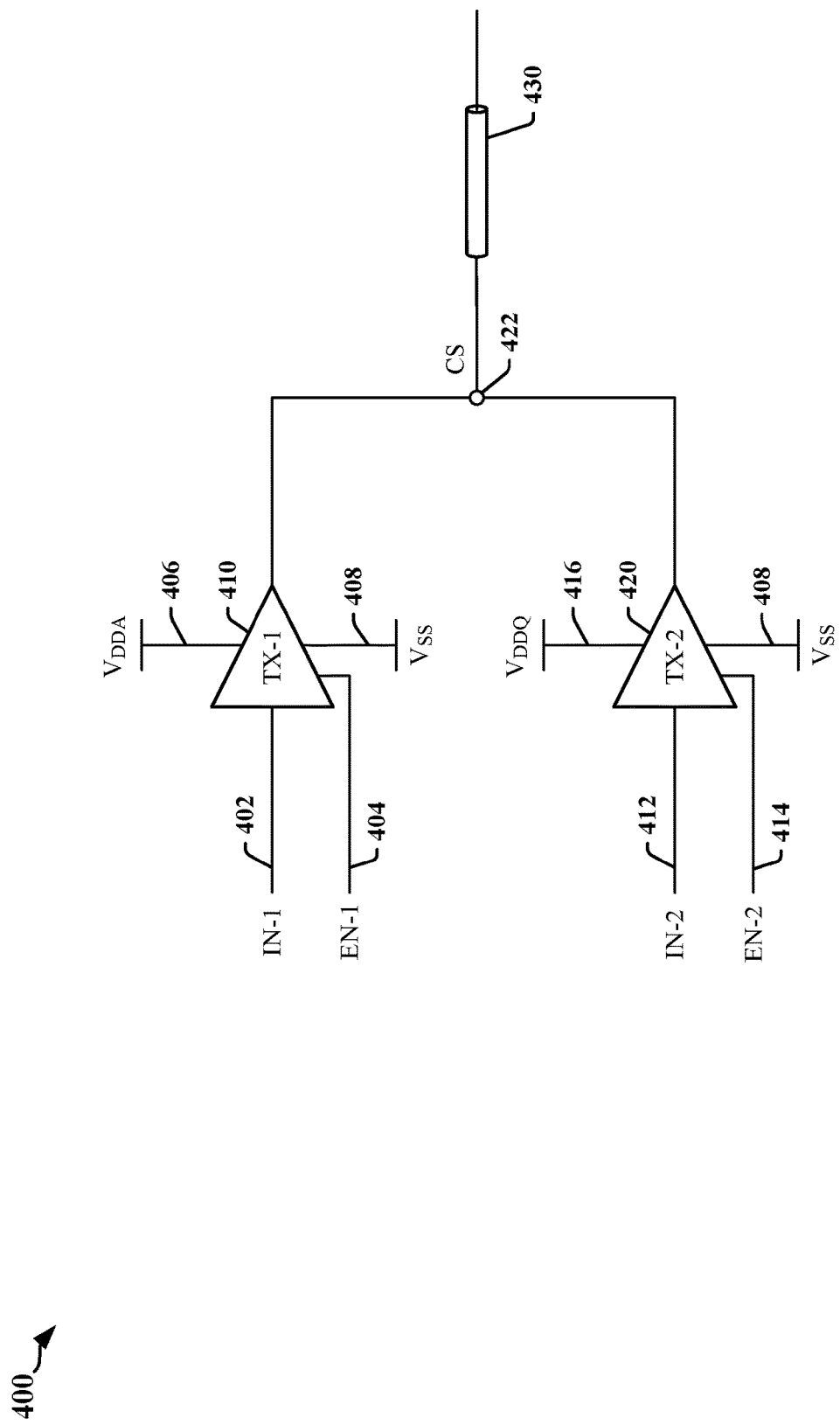
FIG. 4 illustrates a chip select signal driving circuit that may be adapted or configured in accordance with certain aspects of this disclosure.

FIG. 4 illustrates a CS signal driving circuit 400 that may be adapted or configured in accordance with certain aspects of this disclosure. In one example, the CS signal driving circuit 400 is used in a memory subsystem that includes LPDDR5 SDRAM devices and where the CS signal driving circuit 400 may be required to operate at switching frequencies of 1.07 Gbps in the normal mode. In another example, the CS signal driving circuit 400 is used in a memory subsystem that includes LPDDR6 SDRAM devices and the CS signal driving circuit 400 may be required to operate at switching frequencies of 3.2 Gbps in the normal mode. In another example, the CS signal driving circuit 400 is used in a memory subsystem that includes later generation LPDDR SDRAM devices and the CS signal driving circuit 400 may be required to operate at switching frequencies that are greater than 3.2 Gbps in the normal mode.

The CS signal driving circuit 400 includes a TX-1 transmitter 410 and a TX-2 transmitter 420, which have outputs coupled to a CS channel 430 through an output node 422. The output node 422 may be an I/O pad, for example. Each of the transmitters 410, 420 is powered using at least two power rails. The TX-1 transmitter 410 operates at a higher voltage level and is coupled between a rail at what is referred to herein as the $V_{DDA}$ voltage level 406 and a rail at the $V_{SS}$ voltage level 408. The TX-2 transmitter 420 operates at a lower voltage level and is coupled between a rail at the $V_{DDQ}$ voltage level and a rail at the $V_{SS}$ voltage level. Each of the transmitters 410, 420 is controlled by an enable signal 404, 414 that determines when the corresponding transmitter 410, 420 is actively driving the CS channel 430.

In the illustrated example, the TX-1 transmitter 410 can be configured or optimized for the power-down exit mode which requires high voltage, low frequency operation, while the TX-2 transmitter 420 can be configured or optimized for the normal mode which requires low voltage and high frequency operation. In one example, optimizations may involve the selection of the types of transistors or process technology used to construct the transmitters 410, 420. In another example, optimizations may involve the number of sequential amplification stages needed to sufficiently and effectively amplify an input signal 402 or 412 to produce a CS signal with a desired voltage amplitude, with a desired switching speed, and/or with a desired load-driving capability. In another example, optimizations may involve the number of transistors need in each amplification stage to span the desired voltage difference between input and output of a transmitter 410 or 420. In another example, optimizations may involve the level of biasing currents needed to sufficiently and effectively amplify an input signal 402 or 412 to produce a CS signal with a desired voltage amplitude, with a desired switching speed, and/or with a desired load-driving capability. In another example, optimizations may involve the selection of voltage rails provided to the transmitter 410 or 420.

Each transmitter 410, 420 receives an input signal 402 or 412 (IN-1 or IN-2). The input signals 402 or 412 may be derived from a common source of the CS signal and may differ in the types and number of intervening circuits between the common source and the transmitters 410, 420. In one example, the TX-1 transmitter 410 may be fed by circuits that switch between higher intermediate voltage levels than the circuits that feed the TX-2 transmitter 420. In another example, the TX-2 transmitter 420 may be fed by circuits that include transistors capable of faster switching times, albeit at lower operating voltage levels, than the circuits that feed the TX-1 transmitter 410.

The input signals 402, 412 may be provided as differential signals. The IN-1 input signal 402 drives the CS channel 430 when the TX-1 transmitter 410 is enabled. The IN-2 input signal 412 drives the CS channel 430 when the TX-2 transmitter 420 is enabled. Each transmitter is enabled or disabled based on the signaling state of a corresponding enable signal 404 or 414 (EN-1 or EN-2). The TX-1 transmitter 410 is enabled when the EN-1 enable signal 404 is asserted and the TX-2 transmitter 420 is enabled when the EN-2 enable signal 414 is asserted. The output of the TX-1 transmitter 410 is in a high-impedance state when the EN-1 enable signal 404 is not asserted and the output of the TX-2 transmitter 420 is in a high-impedance state when the EN-2 enable signal 414 is not asserted. In a first example, an enable signal 404, 414 is asserted when it is driven to a high signaling state. In a second example, an enable signal 404, 414 is asserted when it is driven to a low signaling state. In a third example, one of the enable signals 404 or 414 is asserted when it is driven to the high signaling state and the other enable signal 414 or 404 is asserted when it is driven to the low signaling state.

The CS signal driving circuit 400 may be configured such that the TX-2 transmitter 420 is enabled during normal modes of operation. The CS signal driving circuit 400 may be further configured such that the TX-1 transmitter 410 is enabled during power-down modes of operation to transmit pulse over the CS channel 430 configured to cause LPDDR SDRAM devices to exit power-down mode and enter a normal mode. Both enable signals 404, 414 may be asserted during an overlap period provided at the transition between modes to prevent glitches or unintended transitions in the CS signal transmitted over the CS channel 430.

Figure 5:
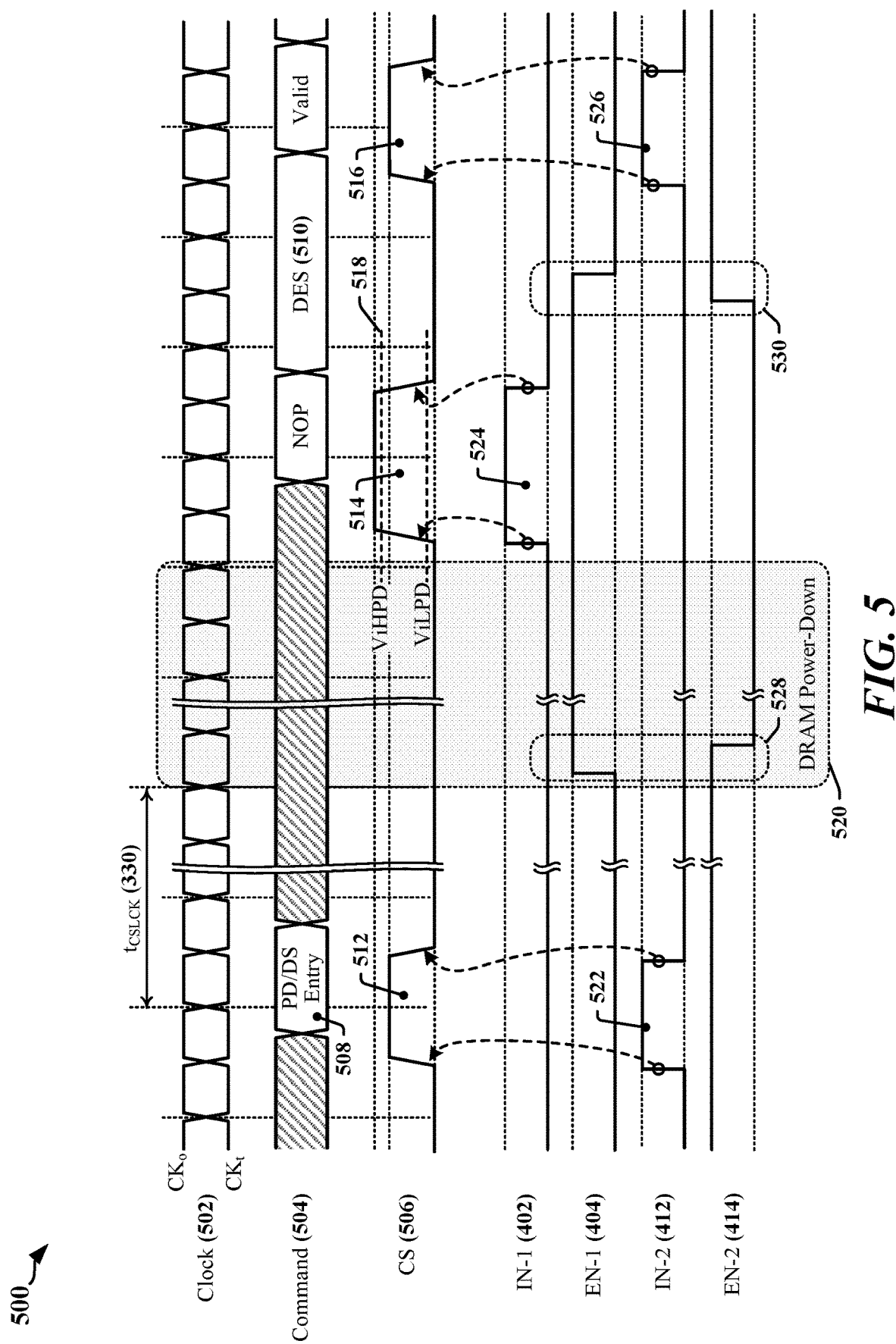
FIG. 5 is a timing diagram illustrates certain aspects of the operation of the chip select signal driving circuit illustrated in FIG. 4.

FIG. 5 is a timing diagram 500 illustrates certain aspects of the operation of the CS signal driving circuit 400 illustrated in FIG. 4. The timing diagram 500 provides an example in which the CS signal driving circuit 400 in a memory subsystem generates CS signaling used to control LPDDR SDRAM devices before and after transitions between a normal mode and in a power-down mode 340. Timing is measured or controlled using a clock signal 502.

In the illustrated example, a first pulse 512 is transmitted over the CS channel 506 while the memory subsystem is operating in normal mode. The EN-2 signal 414 is asserted while the memory subsystem is operating in normal mode and the first pulse 512 is generated by the TX-2 transmitter 420 in response to a corresponding pulse 522 on an input signal 412 received by the TX-2 transmitter 420. The TX-2 transmitter 420 is powered by the $V_{DDQ}$ rail 416 and produces the first pulse 512 with a nominal voltage amplitude defined by the $V_{DDQ}$ voltage level. The first pulse 512 causes an LPDDR SDRAM device to load a power down command 508 transmitted by a memory controller over a CA channel 504.

After a delay, which may correspond to the duration of $V_{CSLCK}$ 330 (see FIG. 3), the LPDDR SDRAM device enters the power-down mode 520 and is configured to exit the power-down mode 520 in response to pulses on the CS channel 506 at the higher ViH_PD voltage level 518. The memory controller transmits a second pulse 514 on the CS channel 506 after exiting from the power-down mode 520. The second pulse 514 is transmitted at the higher ViH_PD voltage level 518 and causes the LPDDR SDRAM device to exit from power-down mode 520. The EN-1 signal 404 is asserted while the memory subsystem is operating in power-down mode 520 and the second pulse 514 is generated by the TX-1 transmitter 410 in response to a corresponding pulse 524 on an input signal 402 received by the TX-1 transmitter 410. The TX-1 transmitter 410 is powered by the $V_{DDA}$ voltage level 406 and produces the first pulse 512 with a voltage amplitude that meets the nominal ViH_PD voltage level 518 defined by specifications. The memory controller may transmit a NOP code over the CA channel 504 while transmitting the second pulse 514 over the CS channel 506. The memory controller may then transmit a device deselect code (the DES code 510) over the CA channel 504 while the CS channel 506 is idle. A third pulse 516 transmitted over the CS channel 506 is generated by the TX-2 transmitter 420 in response to a corresponding pulse 526 on the input signal 412 received by the TX-1 transmitter 420. The third pulse 516 is transmitted when the memory subsystem has resumed normal operation and concurrently with a valid command that may be transmitted over the CA channel 324.

In certain implementations, the EN-1 signal 404 and the EN-2 signal 414 are asserted concurrently when the memory subsystem is entering and exiting the power-down mode 520. The illustrated example shows a first transition zone 528 in which the EN-1 signal 404 is asserted before the EN-2 signal 414 is de-asserted and a second transition zone 530 in which the EN-2 signal 414 is asserted before the EN-1 signal 404 is de-asserted. The concurrent assertion of the EN-1 signal 404 and the EN-2 signal 414 can prevent glitches or indeterminate signaling states on the CS channel 506 during transition between operating modes. The transition zones 528, 530 may be configured to avoid conflict between the transmitters 410, 420. The durations of the transition zones 528, 530 may be selected to ensure that the CS signal is inactive and in a low signaling state for the duration of each transition zone 528, 530, and that both transmitters 410, 420 are actively driving the CS channel 506 to the same signaling state or same voltage level. In certain implementations, a transmitter 410 or 420 is actively driving the CS channel 506 when the transmitter 410 or 420 is powered an output of the transmitter 410 or 420 is following the input of the transmitter 410 or 420 in a manner that sources or sinks a current that flows through the output node 422. In some implementations, an output of a transmitter 410 or 420 may be in a high impedance state when it is not actively driving the CS channel 506. A high-impedance output of a transmitter 410 or 420 nominally sources or sinks no current flowing through the output node 422, or sources or sinks a leakage current that flows through the output node 422.

Figure 6:
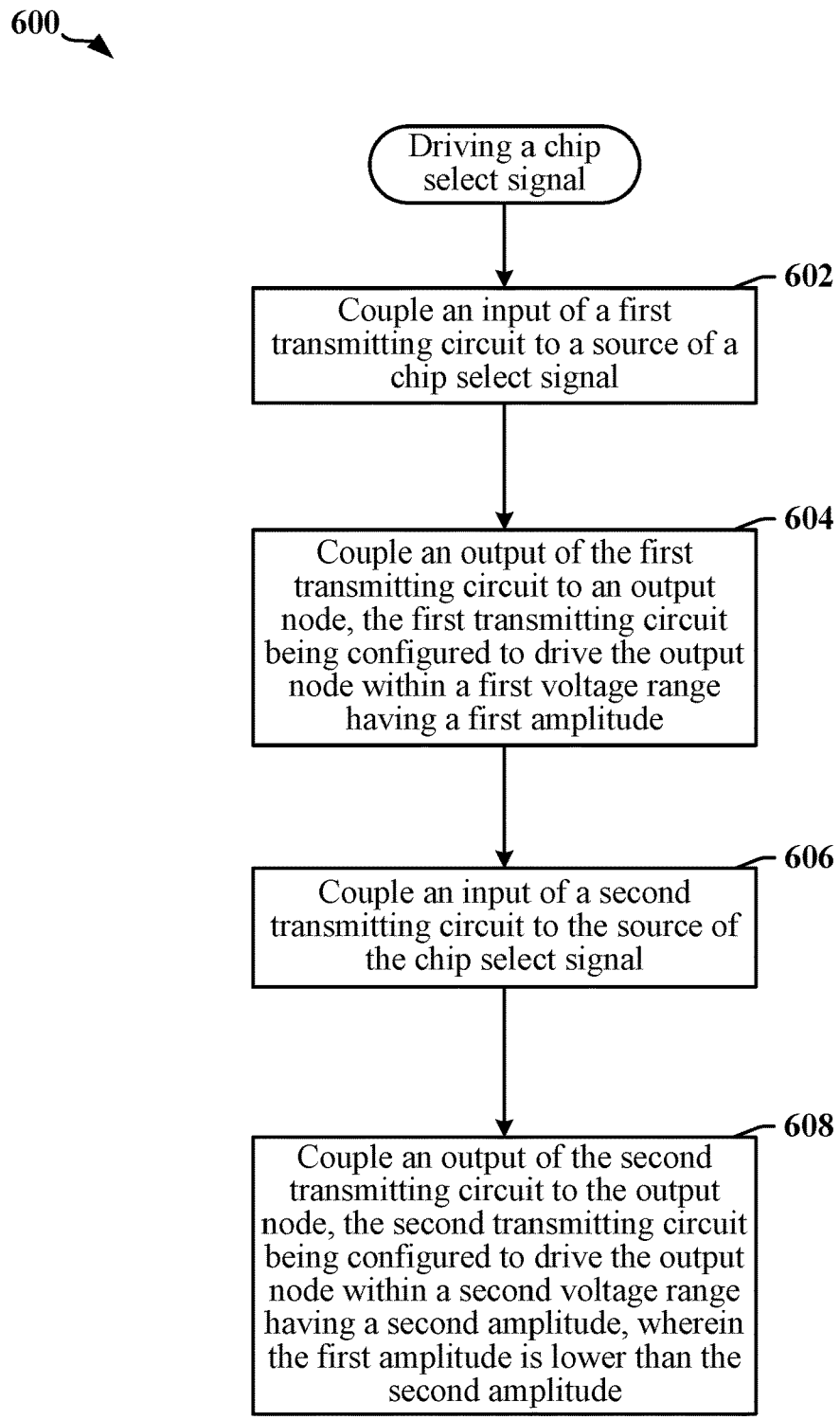
FIG. 6 is a flow diagram illustrating an example of a method for driving a chip select signal in accordance with certain aspects of this disclosure.

FIG. 6 is a flow diagram illustrating an example of a method 600 for driving a chip select signal in accordance with certain aspects of this disclosure. In one example, the method 600 may be implemented using the CS signal driving circuit 400 illustrated in FIG. 4 and may correspond to certain aspects of the timing diagram provided in FIG. 5. At block 602, an input of a first transmitting circuit may be coupled to a source of a chip select signal. At block 604, an output of the first transmitting circuit may be coupled to an output node. The first transmitting circuit may be configured to drive the output node within a first voltage range having a first amplitude. At block 606, an input of a second transmitting circuit may be coupled to the source of the chip select signal. At block 608, an output of the second transmitting circuit may be coupled to the output node. The second transmitting circuit may be configured to drive the output node within a second voltage range having a second amplitude. The first amplitude may be lower than the second amplitude.

In certain implementations, the first transmitting circuit is configured to receive a first enable signal. The output of the first transmitting circuit may actively drive the output node when the first enable signal is asserted. The output of the first transmitting circuit may be placed in a high impedance state when the first enable signal is not asserted. The second transmitting circuit may be configured to receive a second enable signal. The output of the second transmitting circuit may actively drive the output node when the second enable signal is asserted. The output of the second transmitting circuit may be placed in a high impedance state when the second enable signal is not asserted. In one example, the first enable signal is asserted and the second enable signal is not asserted while operating in a first mode of operation. In another example, the first enable signal is not asserted and the second enable signal is asserted while operating in a second mode of operation. The second enable signal may be asserted before the first enable signal is de-asserted at a transition from the first mode of operation to the second mode of operation. The first enable signal may be asserted before the second enable signal is de-asserted at a transition from the second mode of operation to the first mode of operation.

In some implementations, the output node is coupled to a memory device over a chip select channel. In one example, the memory device is a LPDDR SDRAM.

The apparatus and methods described herein and illustrated in the accompanying drawings may be implemented using various blocks, modules, components, circuits, steps, processes, algorithms, etc. (collectively referred to as "elements"). These elements may be implemented using electronic hardware, computer software, or any combination thereof. Whether such elements are implemented as hardware or software depends upon the particular application and design constraints imposed on the overall system According to certain aspects of this disclosure, an apparatus configured to operate as a memory interface circuit includes circuits or modules configured to generate a first output representative of a chip select signal, including a first transmitting circuit having an and an output that is configured to switch within a first voltage range having a first amplitude; circuits or modules configured to generate a second output representative of the chip select signal, including a second transmitting circuit having an output that is configured to switch within a second voltage range having a second amplitude; and an output node. The output node may be coupled to the output of the first transmitting circuit and the output of the second transmitting circuit. The first amplitude may be lower than the second amplitude.

In certain implementations, the first transmitting circuit is configured to receive a first enable signal. The output of the first transmitting circuit may actively drive the output node when the first enable signal is asserted. The output of the first transmitting circuit may be placed in a high impedance state when the first enable signal is not asserted. The second transmitting circuit may be configured to receive a second enable signal. The output of the second transmitting circuit may actively drive the output node when the second enable signal is asserted. The output of the second transmitting circuit may be placed in a high impedance state when the second enable signal is not asserted. In one example, the first enable signal is asserted and the second enable signal is not asserted when the apparatus is operated in a first mode of operation. In another example, the first enable signal is not asserted and the second enable signal is asserted when the apparatus is operated in a second mode of operation. The second enable signal may be asserted before the first enable signal is de-asserted at a transition from the first mode of operation to the second mode of operation. The first enable signal may be asserted before the second enable signal is de-asserted at a transition from the second mode of operation to the first mode of operation.

In some implementations, the output node is configured to be coupled to a memory device over a chip select channel. In one example, the memory device is a LPDDR SDRAM.

In accordance with at least one example described herein, a signal driving circuit has a first transmitting circuit and a second transmitting circuit coupled to an output node. The first transmitting circuit has an input coupled to a source of a chip select signal and an output that is configured to switch within a first voltage range having a first amplitude. The second transmitting circuit has an input coupled to the source of the chip select signal and an output that is configured to switch within a second voltage range having a second amplitude. The output node may be coupled to the output of the first transmitting circuit and the output of the second transmitting circuit. The first amplitude may be lower than the second amplitude.

In certain implementations, the first transmitting circuit is configured to receive a first enable signal. The output of the first transmitting circuit may actively drive the output node when the first enable signal is asserted. The output of the first transmitting circuit may be placed in a high impedance state when the first enable signal is not asserted. The second transmitting circuit may be configured to receive a second enable signal. The output of the second transmitting circuit may actively drive the output node when the second enable signal is asserted. The output of the second transmitting circuit may be placed in a high impedance state when the second enable signal is not asserted. In one example, the first enable signal is asserted and the second enable signal is not asserted when the signal driving circuit is operated in a first mode of operation. In another example, the first enable signal is not asserted and the second enable signal is asserted when the signal driving circuit is operated in a second mode of operation. The second enable signal may be asserted before the first enable signal is de-asserted at a transition from the first mode of operation to the second mode of operation. The first enable signal may be asserted before the second enable signal is de-asserted at a transition from the second mode of operation to the first mode of operation.

In some implementations, the output node is configured to be coupled to a memory device over a chip select channel. In one example, the memory device is a LPDDR SDRAM.

In some implementations, certain functions or portions of functions may be implemented using software that resides in computer-readable form in a memory device or in other computer-readable medium. The computer-readable medium may include a non-transitory computer-readable medium. A non-transitory computer-readable medium includes, by way of example, a magnetic storage device (e.g., hard disk, floppy disk, magnetic strip), an optical disk (e.g., a compact disc (CD) or a digital versatile disc (DVD)), a smart card, a flash memory device (e.g., a "flash drive," a card, a stick, or a key drive), RAM, ROM, a programmable read-only memory (PROM), an erasable PROM (EPROM) including EEPROM, a register, a removable disk, and any other suitable medium for storing software and/or instructions that may be accessed and read by a computer.

In some implementations, the computer-readable medium maintains instructions and information where the instructions are configured to cause one or more processors or controllers to execute certain functions and processes.

In one example, a processor-readable storage medium stores or maintains code for coupling an input of a first transmitting circuit to a source of a chip select signal; coupling an output of the first transmitting circuit to an output node, the first transmitting circuit being configured to drive the output node within a first voltage range having a first amplitude; coupling an input of a second transmitting circuit to the source of the chip select signal; and coupling an output of the second transmitting circuit to the output node, the second transmitting circuit being configured to drive the output node within a second voltage range having a second amplitude. The first amplitude may be lower than the second amplitude.

In certain implementations, the first transmitting circuit is configured to receive a first enable signal. The output of the first transmitting circuit may actively drive the output node when the first enable signal is asserted. The output of the first transmitting circuit may be placed in a high impedance state when the first enable signal is not asserted. The second transmitting circuit may be configured to receive a second enable signal. The output of the second transmitting circuit may actively drive the output node when the second enable signal is asserted. The output of the second transmitting circuit may be placed in a high impedance state when the second enable signal is not asserted. In one example, the first enable signal is asserted and the second enable signal is not asserted while operating in a first mode of operation. In another example, the first enable signal is not asserted and the second enable signal is asserted while operating in a second mode of operation. The second enable signal may be asserted before the first enable signal is de-asserted at a transition from the first mode of operation to the second mode of operation. The first enable signal may be asserted before the second enable signal is de-asserted at a transition from the second mode of operation to the first mode of operation.

In some implementations, the output node is configured to be coupled to a memory device over a chip select channel. In one example, the memory device is a LPDDR SDRAM.

Some implementation examples are described in the following numbered clauses:

1. A signal driving circuit comprising: a first transmitting circuit having an input coupled to a source of a chip select signal and an output that is configured to switch within a first voltage range having a first amplitude; a second transmitting circuit having an input coupled to the source of the chip select signal and an output that is configured to switch within a second voltage range having a second amplitude; and an output node coupled to the output of the first transmitting circuit and the output of the second transmitting circuit, wherein the first amplitude is lower than the second amplitude.
2. The signal driving circuit as described in clause 1, wherein the first transmitting circuit is configured to receive a first enable signal, wherein the output of the first transmitting circuit actively drives the output node when the first enable signal is asserted, and wherein the output of the first transmitting circuit is in a high impedance state when the first enable signal is not asserted.
3. The signal driving circuit as described in clause 2, wherein the second transmitting circuit is configured to receive a second enable signal, wherein the output of the second transmitting circuit actively drives the output node when the second enable signal is asserted, and wherein the output of the second transmitting circuit is in a high impedance state when the second enable signal is not asserted.
4. The signal driving circuit as described in clause 3, wherein the first enable signal is asserted and the second enable signal is not asserted when the signal driving circuit is operated in a first mode of operation, wherein the first enable signal is not asserted and the second enable signal is asserted when the signal driving circuit is operated in a second mode of operation.
5. The signal driving circuit as described in clause 4, wherein the second enable signal is asserted before the first enable signal is de-asserted at a transition from the first mode of operation to the second mode of operation.
6. The signal driving circuit as described in clause 4 or clause 5, wherein the first enable signal is asserted before the second enable signal is de-asserted at a transition from the second mode of operation to the first mode of operation.
7. The signal driving circuit as described in any of clauses 1-6, wherein the output node is configured to be coupled to a memory device over a chip select channel.
8. The signal driving circuit as described in clause 7, wherein the memory device comprises a Low-Power Double Data Rate Synchronous Dynamic Random Access Memory (LPDDR SDRAM).
9. A method for driving a chip select signal, comprising: coupling an input of a first transmitting circuit to a source of a chip select signal; coupling an output of the first transmitting circuit to an output node, the first transmitting circuit being configured to drive the output node within a first voltage range having a first amplitude; coupling an input of a second transmitting circuit to the source of the chip select signal; and coupling an output of the second transmitting circuit to the output node, the second transmitting circuit being configured to drive the output node within a second voltage range having a second amplitude, wherein the first amplitude is lower than the second amplitude.
10. The method as described in clause 9, wherein the first transmitting circuit is configured to receive a first enable signal, wherein the output of the first transmitting circuit actively drives the output node when the first enable signal is asserted, and wherein the output of the first transmitting circuit is in a high impedance state when the first enable signal is not asserted.
11. The method as described in clause 10, wherein the second transmitting circuit is configured to receive a second enable signal, wherein the output of the second transmitting circuit actively drives the output node when the second enable signal is asserted, and wherein the output of the second transmitting circuit is in a high impedance state when the second enable signal is not asserted.

12. The method as described in clause 11, wherein the first enable signal is asserted and the second enable signal is not asserted while operating in a first mode of operation, and wherein the first enable signal is not asserted and the second enable signal is asserted while operating in a second mode of operation.

13. The method as described in clause 12, wherein the second enable signal is asserted before the first enable signal is de-asserted at a transition from the first mode of operation to the second mode of operation.

14. The method as described in clause 12 or clause 13, wherein the first enable signal is asserted before the second enable signal is de-asserted at a transition from the second mode of operation to the first mode of operation.

15. The method as described in any of clauses 9-14, further comprising: coupling the output node to a memory device over a chip select channel.

16. The method as described in clause 15, wherein the memory device comprises a Low-Power Double Data Rate Synchronous Dynamic Random Access Memory (LPDDR SDRAM).

17. An apparatus comprising: means for generating a first output representative of a chip select signal, including a first transmitting circuit having an and an output that is configured to switch within a first voltage range having a first amplitude; means for generating a second output representative of the chip select signal, including a second transmitting circuit having an output that is configured to switch within a second voltage range having a second amplitude; and an output node coupled to the output of the first transmitting circuit and the output of the second transmitting circuit, wherein the first amplitude is lower than the second amplitude.

18. The apparatus as described in clause 17, wherein the first transmitting circuit is configured to receive a first enable signal, wherein the output of the first transmitting circuit actively drives the output node when the first enable signal is asserted, and wherein the output of the first transmitting circuit is in a high impedance state when the first enable signal is not asserted.

19. The apparatus as described in clause 18, wherein the second transmitting circuit is configured to receive a second enable signal, wherein the output of the second transmitting circuit actively drives the output node when the second enable signal is asserted, and wherein the output of the second transmitting circuit is in a high impedance state when the second enable signal is not asserted.

20. The apparatus as described in clause 19, wherein the first enable signal is asserted and the second enable signal is not asserted when the apparatus is operated in a first mode of operation, wherein the first enable signal is not asserted and the second enable signal is asserted when the apparatus is operated in a second mode of operation.

21. The apparatus as described in clause 20, wherein the second enable signal is asserted before the first enable signal is de-asserted at a transition from the first mode of operation to the second mode of operation.

22. The apparatus as described in clause 20 or clause 21, wherein the first enable signal is asserted before the second enable signal is de-asserted at a transition from the second mode of operation to the first mode of operation.

23. The apparatus in any of clauses 17-22, wherein the output node is configured to be coupled to a memory device over a chip select channel.

24. The apparatus as described in clause 23, wherein the memory device comprises a Low-Power Double Data Rate Synchronous Dynamic Random Access Memory (LPDDR SDRAM).

As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The present disclosure is provided to enable any person skilled in the art to make or use aspects of the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A signal driving circuit comprising:
   a first transmitting circuit having an input coupled to a source of a chip select signal and an output that is configured to switch within a first voltage range having a first amplitude;
   a second transmitting circuit having an input coupled to the source of the chip select signal and an output that is configured to switch within a second voltage range having a second amplitude; and
   an output node coupled to the output of the first transmitting circuit and the output of the second transmitting circuit,
   wherein the first amplitude is lower than the second amplitude,
   wherein the first transmitting circuit is configured to receive a first enable signal, wherein the output of the first transmitting circuit actively drives the output node when the first enable signal is asserted,
   wherein the second transmitting circuit is configured to receive a second enable signal, wherein the output of the second transmitting circuit actively drives the output node when the second enable signal is asserted,
   wherein the first enable signal is asserted and the second enable signal is not asserted when the signal driving circuit is operated in a first mode of operation,
   wherein the first enable signal is not asserted and the second enable signal is asserted when the signal driving circuit is operated in a second mode of operation, and
   wherein the second enable signal is asserted before the first enable signal is de-asserted at a transition from the first mode of operation to the second mode of operation.

2. The signal driving circuit of claim 1, wherein the output of the first transmitting circuit is in a high impedance state when the first enable signal is not asserted.

3. The signal driving circuit of claim 2, wherein the output of the second transmitting circuit is in a high impedance state when the second enable signal is not asserted.

4. The signal driving circuit of claim 1, wherein the first enable signal is asserted before the second enable signal is de-asserted at a transition from the second mode of operation to the first mode of operation.

5. The signal driving circuit of claim 1, wherein the output node is configured to be coupled to a memory device over a chip select channel.

6. The signal driving circuit of claim 5, wherein the memory device comprises a Low-Power Double Data Rate Synchronous Dynamic Random Access Memory (LPDDR SDRAM).

7. A method for driving a chip select signal, comprising:
coupling an input of a first transmitting circuit to a source of a chip select signal;
coupling an output of the first transmitting circuit to an output node, the first transmitting circuit being configured to drive the output node within a first voltage range having a first amplitude;
coupling an input of a second transmitting circuit to the source of the chip select signal; and
coupling an output of the second transmitting circuit to the output node, the second transmitting circuit being configured to drive the output node within a second voltage range having a second amplitude, wherein the first amplitude is lower than the second amplitude,
wherein the first transmitting circuit is configured to receive a first enable signal, wherein the output of the first transmitting circuit actively drives the output node when the first enable signal is asserted,
wherein the second transmitting circuit is configured to receive a second enable signal, wherein the output of the second transmitting circuit actively drives the output node when the second enable signal is asserted,
wherein the first enable signal is asserted and the second enable signal is not asserted when the signal driving circuit is operated in a first mode of operation,
wherein the first enable signal is not asserted and the second enable signal is asserted when the signal driving circuit is operated in a second mode of operation, and
wherein the second enable signal is asserted before the first enable signal is de-asserted at a transition from the first mode of operation to the second mode of operation.

8. The method of claim 7, wherein the output of the first transmitting circuit is in a high impedance state when the first enable signal is not asserted.

9. The method of claim 8, wherein the output of the second transmitting circuit is in a high impedance state when the second enable signal is not asserted.

10. The method of claim 7, wherein the first enable signal is asserted before the second enable signal is de-asserted at a transition from the second mode of operation to the first mode of operation.

11. The method of claim 7, further comprising:
coupling the output node to a memory device over a chip select channel.

12. The method of claim 11, wherein the memory device comprises a Low-Power Double Data Rate Synchronous Dynamic Random Access Memory (LPDDR SDRAM).

13. An apparatus comprising:
means for generating a first output representative of a chip select signal, including a first transmitting circuit having an and an output that is configured to switch within a first voltage range having a first amplitude;
means for generating a second output representative of the chip select signal, including a second transmitting circuit having an output that is configured to switch within a second voltage range having a second amplitude; and
an output node coupled to the output of the first transmitting circuit and the output of the second transmitting circuit, wherein the first amplitude is lower than the second amplitude,
wherein the first transmitting circuit is configured to receive a first enable signal,
wherein the output of the first transmitting circuit actively drives the output node when the first enable signal is asserted,
wherein the second transmitting circuit is configured to receive a second enable signal, wherein the output of the second transmitting circuit actively drives the output node when the second enable signal is asserted,
wherein the first enable signal is asserted and the second enable signal is not asserted when the signal driving circuit is operated in a first mode of operation,
wherein the first enable signal is not asserted and the second enable signal is asserted when the signal driving circuit is operated in a second mode of operation, and
wherein the second enable signal is asserted before the first enable signal is de-asserted at a transition from the first mode of operation to the second mode of operation.

14. The apparatus of claim 13, wherein the output of the first transmitting circuit is in a high impedance state when the first enable signal is not asserted.

15. The apparatus of claim 14, wherein the output of the second transmitting circuit is in a high impedance state when the second enable signal is not asserted.

16. The apparatus of claim 13, wherein the first enable signal is asserted before the second enable signal is de-asserted at a transition from the second mode of operation to the first mode of operation.

17. The apparatus of claim 13, wherein the output node is configured to be coupled to a memory device over a chip select channel.

18. The apparatus of claim 17, wherein the memory device comprises a Low-Power Double Data Rate Synchronous Dynamic Random Access Memory (LPDDR SDRAM).

* * * * *